United States Patent

Arai et al.

[11] Patent Number: 6,054,509
[45] Date of Patent: Apr. 25, 2000

[54] ADHESIVE OF EPOXY RESIN, NITRILE RUBBERS AND CURING AGENT

[75] Inventors: Hitoshi Arai; Masahiro Yuyama; Yoshitsugu Eguchi, all of Kamisu-machi, Japan

[73] Assignee: Shin-Etsu Chemical Co., Ltd., Tokyo, Japan

[21] Appl. No.: 09/114,278

[22] Filed: Jul. 13, 1998

[30] Foreign Application Priority Data

Aug. 28, 1997 [JP] Japan ................................ 9-232642

[51] Int. Cl.⁷ ............................. C08K 3/22; C08L 63/02; C08L 63/04
[52] U.S. Cl. ......................... 523/428; 523/434; 523/457; 525/108
[58] Field of Search ............................. 525/108; 523/428, 523/434, 457

[56] References Cited

U.S. PATENT DOCUMENTS

| | | | |
|---|---|---|---|
| 5,260,130 | 11/1993 | Sakaguchi et al. | 525/113 |
| 5,783,625 | 7/1998 | Mori et al. | 524/432 |
| 5,859,155 | 1/1999 | Furihata et al. | 525/527 |

FOREIGN PATENT DOCUMENTS

| | | |
|---|---|---|
| 61-108679 | 5/1986 | Japan. |
| 1-85271 | 3/1989 | Japan. |
| 2-180977 | 7/1990 | Japan. |
| 3-28285 | 2/1991 | Japan. |
| 3-111464 | 5/1991 | Japan. |
| 5-279639 | 10/1993 | Japan. |
| 6-322324 | 11/1994 | Japan. |
| 9-51164 | 2/1997 | Japan. |
| 10-81858 | 3/1998 | Japan. |

*Primary Examiner*—Robert E. Sellers
*Attorney, Agent, or Firm*—Dougherty & Troxell

[57] ABSTRACT

Provided by the invention is a thermosetting adhesive composition suitable for use in the preparation of metal foil-laminated base sheets of flexible printed circuit boards and laminated product related thereto such as coverlay films and bonding sheets. The adhesive composition is a uniform blend which comprises: (A) an epoxy resin including a brominated epoxy resin to exhibit flame retardancy; (B) a combination of two or three kinds of different nitrile rubbers distinguishable relative to the iodine value and content of carboxyl groups at the molecular chain ends in a specified weight proportion; (C) a curing agent for the epoxy resin; and (D) a curing accelerator, with optional admixture of (E) an inorganic filler; and/or (F) a vulcanizing agent for the nitrile rubbers.

17 Claims, No Drawings

ADHESIVE OF EPOXY RESIN, NITRILE RUBBERS AND CURING AGENT

BACKGROUND OF THE INVENTION

The present invention relates to a thermosetting adhesive composition or, more particularly, to a thermosetting adhesive composition based on an epoxy resin and a nitrile rubber and suitable for use in the preparation of substrate plates for flexible printed circuit boards and related products thereof such as coverlay films, bonding sheets having a layered structure by utilizing excellent properties relative to the adhesive bonding strength, heat resistance and others even after a prolonged heating treatment at an elevated temperature.

Along with the remarkable progress in the technology of electronics, it is a trend in recent years that electronic instruments used in a variety of application fields such as communication and civil life are required more and more to be compact in size and light in weight with a high degree of integration of various functions. Many of modern electronic instruments are therefore constructed and assembled by using flexible printed circuit boards which can be mounted and enclosed in a relatively narrow space by utilizing the flexibility thereof so that the instruments can be constructed with efficient three-dimensional utilization of the space within the casing of the instrument leaving little spaces left unutilized. Accordingly, application fields of flexible printed circuit boards are expanding year by year as a composite part to exhibit the functions not only as a circuit wiring means but also as a cable and connector means.

The above mentioned flexible printed circuit board is manufactured from an integrally laminated sheet material consisting of a flexible base film of a plastic resin having high heat resistance and excellent electric and mechanical properties and a metal foil adhesively bonded to one surface of the base film with intervention of an adhesive layer by patterning the metal foil by a conventional method into the pattern of a wiring circuit to serve as a part of the respective electronic instrument. Thus, such a flexible circuit board is required to exhibit good adhesion between the base film and the metal foil in addition to the requirements for good flexibility, high heat resistance and excellent electric properties as well as workability into a printed circuit board.

It is sometimes the case depending on the mode of application that the thus circuit-patterned layer of the metal foil is protected by attaching and bonding a coverlay film thereto. As a trend in recent years, many of the flexible printed circuit boards are provided with a pressure-sensitive adhesive coverlay film thereon attached by pressing thereto with an object to protect the circuit wiring layer and to improve the flexibility characteristic. The coverlay film used in this way is made from an insulating plastic resin film coated on one surface with an adhesive in a semi-cured state and the adhesive surface before use is protected by attaching a releasable protective sheet. Coverlay films are required to have excellent storage stability of the adhesive layer in addition to the adhesive characteristic, heat resistance, electric properties and workability.

Further, a so-called bonding sheet is sometimes used in the preparation of, for example, a multilayered flexible printed circuit board by adhesively bonding two flexible printed circuit boards as described above. A bonding sheet is prepared by uniformly coating the releasing surface of a releasable sheet with an adhesive in a semi-cured state and then attaching another releasable sheet to the adhesive surface thus to sandwich an adhesive layer with two releasable sheets. The requirements for the performance of bonding sheets are similar to those for the coverlay films.

As is readily understood from the above given description, the requirements for the performance of the materials in the manufacture of flexible printed circuit boards, including the flexible base sheets for circuit boards, coverlay films and bonding sheets, cannot be satisfied without use of an appropriate adhesive. In this regard, various adhesive compositions are proposed in the prior art, for example, in Japanese Patent Publication 5-62156, Japanese Patent Kokai 63-297483, 4-206112 and 64-26690 and elsewhere as suitable for use in the products of flexible printed circuit boards including those based on a nylon resin and epoxy resin, acrylic resin and phenolic resin, polyester resin and epoxy resin, nitrile rubber and epoxy resin and so on. Those based on a nitrile rubber and an epoxy resin are known to be an adhesive of high adhesion capable of exhibiting a relatively good balance of various properties though not without problems because the nitrile rubber per se contains a large number of ethylenically unsaturated bonds in the molecular structure which are subject to degradation when the adhesive composition is prolongedly heated at an elevated temperature resulting in a great decrease in the peeling resistance.

SUMMARY OF THE INVENTION

The present invention accordingly has a primary object to provide, in view of the above described problems and disadvantages in the prior art adhesives, a novel thermosetting adhesive composition based on an epoxy resin and a nitrile rubber, which is free from degradation even after a prolonged heating treatment at an elevated temperature without a decrease in the peeling resistance so as to be suitable for use in the manufacture of flexible printed circuit boards and related products.

Thus, the thermosetting adhesive composition provided according to the first aspect of the present invention is a uniform blend which comprises:

(A) 100 parts by weight of an epoxy resin;

(B) from 30 to 150 parts by weight of a binary combination of nitrile rubbers consisting of (B1) a first nitrile rubber having an iodine value in the range from 200 to 350 g $I_2$/100 g, of which the weight fraction of the acrylonitrile moiety is in the range from 20% to 50%, and containing carboxyl groups at the molecular chain ends in an amount in the range from 0.005% to 5% by weight, and (B2) a second nitrile rubber, of which the weight fraction of the acrylonitrile moiety is in the range from 20% to 50%, having an iodine value not exceeding 60 g $I_2$/100 g and free from functional groups at the molecular chain ends, in a weight proportion of B1:B2 in the range from 85:15 to 40:60;

(C) from 2 to 20 parts by weight of a curing agent for the epoxy resin selected from the group consisting of aliphatic amine compounds, aromatic amine compounds, acid anhydride compounds, dicyandiamide and complexes of an amine compound and boron trifluoride; and (D) from 0.1 to 3 parts by weight of a curing accelerator selected from the group consisting of imidazole compounds, borofluoride compounds and metal salts of octoic acid.

According to the second aspect of the invention, the thermosetting adhesive composition provided by the invention comprises, as a uniform blend:

(A) 100 parts by weight of an epoxy resin;
(B) from 30 to 150 parts by weight of a ternary combination of nitrile rubbers consisting of
  (B1) a first nitrile rubber having an iodine value in the range from 200 to 350 g $I_2$/100 g, of which the weight fraction of the acrylonitrile moiety is in the range from 20% to 50%, and containing carboxyl groups at the molecular chain ends in an amount in the range from 0.005% to 5% by weight,
  (B2) a second nitrile rubber, of which the weight fraction of the acrylonitrile moiety is in the range from 20% to 50%, having an iodine value not exceeding 60 g $I_2$/100 g and free from functional groups at the molecular chain ends, and
  (B3) a third nitrile rubber having an iodine value in the range from 200 to 350 g $I_2$/100 g, of which the weight fraction of the acrylonitrile moiety is in the range from 20% to 50%, and having no functional groups at the molecular chain ends, in such a weight proportion that the ratio of (B1+B3):B2 is in the range from 85:15 to 40:60, the ratio of B1:(B2+B3) is in the range from 85:15 to 40:60 and the ratio of B3:(B1+B2) is in the range from 5:95 to 60:40;
(C) from 2 to 20 parts by weight of a curing agent for the epoxy resin; and
(D) from 0.1 to 3 parts by weight of a curing accelerator selected from the group consisting of imidazole compounds, borofluoride compounds and metal salts of octoic acid.

It is optional according to need that the above defined thermosetting adhesive composition according to the first or second aspect of the invention is further compounded with:
(E) from 5 to 50 parts by weight of an inorganic filler; and/or
(F) from 0.2 to 10 parts by weight of a vulcanizing agent for the nitrile rubbers.

DETAILED DESCRIPTION OF THE PREFERRED EMBODIMENTS

The above defined thermosetting adhesive composition is particularly useful in the preparation of the products related to flexible printed circuit boards including metal foil laminates as a base sheet of flexible printed circuit boards, coverlay films and bonding sheets.

The above mentioned metal foil laminate as a base sheet of flexible printed circuit boards has a three-layered structure consisting of an electrically insulating flexible plastic resin film and a metal foil adhesively bonded to one surface of the base film with intervention of a layer of a thermosetting adhesive composition. Though not particularly limitative, the adhesive layer intervening between the base resin film and the metal foil usually has a thickness in the range from 10 to 20 μm.

The coverlay film also has a three-layered structure consisting of an electrically insulating plastic resin film, a layer of a thermosetting adhesive composition in a semi-cured state formed on one surface of the insulating resin film and a releasable protective sheet attached and bonded to the adhesive surface. Though not particularly limitative, the adhesive layer intervening between the insulating resin film and the releasable protective sheet usually has a thickness in the range from 15 to 50 μm.

The bonding sheet again has a three-layered structure consisting of two releasable sheets with the respective releasing surfaces facing each other with intervention of a layer of a thermosetting adhesive composition in a semi-cured state. Though not particularly limitative, the adhesive layer intervening between the two releasable sheets usually has a thickness in the range from 15 to 50 μm.

The plastic resin material forming the electrically insulating film as a base of the above described products is not particularly limitative and can be selected from a variety of known plastic resins including polyimide resins, polyethylene terephthalate resins, polybutylene terephthalate resins, poly(parabanic acid) resins, polyether-ether ketone resins, poly(phenylene sulfide) resins, aramid resins and the like, of which polyimide resins are particularly preferable for most applications in respect of their excellent heat resistance, dimensional stability and mechanical properties.

Though widely dependent on the particularly intended application of the product, the thickness of the insulating plastic resin film is usually in the range from 12.5 to 75 μm. It is optional according to need that the plastic resin film is subjected on one or both of the surfaces to a surface treatment such as a low temperature plasma treatment, corona discharge treatment and sand blasting.

The metal foil to be adhesively bonded to the above mentioned insulating plastic resin film to prepare a base sheet of a flexible printed circuit board can be selected from a variety of metal foils including electrolytic copper foils, rolled copper foils, aluminum foils, tungsten foils, iron foils and the like, of which the electrolytic and rolled copper foils are the most widely employed metal foils in respect of their good flexibility and high electric conductivity. Though widely dependent on the particularly intended application of the product, the thickness of the metal foil is usually in the range from 18 to 70 μm.

The releasable protective sheet used in the manufacture of the coverlay film or the bonding sheet is a film of a plastic resin such as polyethylene, polypropylene, TPX resins, polyethylene terephthalate resins and the like coated, for example, with a silicone-based releasing agent as well as paper sheets coated with a polyethylene, polypropylene or TPX resin. Though widely dependent on the particularly intended application of the product, the thickness of the releasable sheet is usually in the range from 13 to 75 μm in those based on a plastic resin film and in the range from 50 to 200 μm in those based on a paper sheet.

One of the polymeric ingredients in the inventive thermosetting adhesive composition is an epoxy resin which should be a polyfunctional epoxy resin having at least two epoxy groups in a molecule. Examples of suitable epoxy resins include bisphenol A-type epoxy resins, bisphenol F-type epoxy resins, novolak-type epoxy resins, glycidylamine-type epoxy resins and the like.

If it is desired to obtain flame retardancy of the adhesive composition, these epoxy resins can be selected from halogenated or, in particular, brominated epoxy resins. Although highest flame retardancy can be obtained by the use of a brominated epoxy resin alone as the epoxy resin component, i.e. component (A), it is sometimes advantageous to employ a brominated epoxy resin and a non-halogenated epoxy resin in combination because the use of a brominated epoxy resin alone may cause a decrease in the heat resistance and solvent resistance of the adhesive composition. Various commercial grades of brominated epoxy resin products are available on the market including those sold under the trade names of Epikotes 5050, 5049, 5048 and 5045 containing about 49%, 26%, 25% and 19% by weight, respectively, of bromine (each a product by Yuka Shell Epoxy Co.), Bren-S containing about 35% by weight of bromine (a product by Nippon Kayaku Co.) and others. Examples of suitable non-halogenated epoxy resin products available on the market include those sold under the trade names of Epikotes 828, 1001, 152 and 154 (each a product by Yuka Shell Epoxy Co.), Econs 102S, 103S and 104S (each a product by Nippon Kayaku Co.) and others. These non-halogenated and brominated epoxy resins can be used either singly or as a combination of two kinds or more according to need.

The other of the polymeric ingredients in the inventive thermosetting adhesive composition is a rubbery polymer as the component (B) which is a binary or ternary combination of two or three different nitrile rubbers. The nitrile rubber here implied is basically a copolymeric rubber of acrylonitrile and one or more of conjugated diolefin monomers having 3 to 5 carbon atoms in a molecule such as 1,3-butadiene, isoprene, 1,3-pentadiene and the like, of which 1,3is so typical so that the nitrile rubber is sometimes referred to as an NBR.

The first of the nitrile rubbers, i.e. the component (B1), is a nitrile rubber having an iodine value in the range from 200 to 350 g $I_2$/100 g or, preferably, from 220 to 330 g $I_2$/100 g without or with little hydrogenation, of which the weight fraction of the acrylonitrile moiety is in the range from 20% to 50% or, preferably, from 25% to 45%, and having carboxyl groups at the molecular chain ends in an amount in the range from 0.005% to 5% by weight or, preferably, from 0.01% to 1% by weight. Such a carboxyl-terminated nitrile rubber can be prepared by the copolymerization reaction of a ternary monomer mixture consisting of acrylonitrile, one or more of the above mentioned diene monomers, e.g., 1,3-butadiene, and a carboxyl-containing ethylenically unsaturated monomeric compound such as acrylic acid and methacrylic acid. The proportion of the above mentioned three types of the comonomers should be so selected that the weight fraction of the acrylonitrile moiety and the content of the carboxyl groups in the copolymeric rubber are each within the above mentioned range. When the weight fraction of the acrylonitrile moiety is too small, the adhesive composition formulated with such a nitrile rubber cannot exhibit full adhesiveness while, when the weight fraction of the acrylonitrile moiety is too large, a remarkable decrease is caused in the electric properties of the adhesive composition along with a decrease in the solvent resistance and compatibility of the nitrile rubber with the other polymeric ingredients so as to adversely affect the storage stability of the composition. When the content of the terminal carboxyl groups is too low, the adhesive composition suffers a decrease in the solvent resistance due to the deficiency in the reactivity of the nitrile rubber while, when the content of the carboxyl groups is too high, a decrease is caused in the adhesiveness and in the electric properties of the composition. The copolymeric nitrile rubber obtained by the copolymerization is used without hydrogenation so that the double bonds originating from the diene monomer are retained as such to give the above mentioned iodine value.

Several grades of commercial products are available on the market as the nitrile rubber to meet the above described various requirements for the component (B1) including those sold under the trade names of Nipols 1072 (iodine value 270 g $I_2$/100 g), 1072B (iodine value 270 g $I_2$/100 g), 1072J (iodine value 270 g $I_2$/100 g), DN 631 (iodine value 270 g $I_2$/100 g) and DN 601 (iodine value 315 g $I_2$/100 g) (each a product by Nippon Zeon Co.). These commercial products of nitrile rubbers can be used as such in the preparation of the inventive adhesive composition either singly or as a combination of two kinds or more according to need.

The second nitrile rubber as the component (B2) is a nitrile rubber, of which the weight fraction of the acrylonitrile moiety is in the range from 20% to 50% or, preferably, from 25% to 45%, having an iodine value substantially equal to zero or not exceeding 60 g $I_2$/100 g or, preferably, not exceeding 30 g $I_2$/100 g. This nitrile rubber has no functional groups at the molecular chain ends such as the carboxyl groups in the first nitrile rubber so that this nitrile rubber can be obtained by the copolymerization reaction of acrylonitrile and one or more of the diene monomers. The above mentioned iodine value of the nitrile rubber can be obtained by the hydrogenation of all or a part of the double bonds in the rubbery copolymer. When the weight fraction of the acrylonitrile moiety in this second nitrile rubber is too small, full adhesiveness cannot be exhibited by the adhesive composition while, when the weight fraction of the acrylonitrile moiety is too large, a remarkable decrease is caused in the electric properties of the composition along with a decrease in the compatibility of the nitrile rubber with an organic solvent and the other polymeric ingredients adversely affecting the storage stability of the adhesive composition. When the iodine value of the nitrile rubber is too high, degradation of the adhesive composition is caused by a prolonged heat treatment resulting in a decrease in the peeling resistance.

Several grades of commercial products are available on the market as a nitrile rubber to meet the above mentioned various requirements for the component (B2) including those sold under the trade names of Z-pol 1020 having an iodine value of 25 g $I_2$/100 g, Z-pol 1010 having an iodine value of 10 g $I_2$/100 g, Z-pol 2030L having an iodine value of 57 g $I_2$/100 g, Z-pol 2020 having an iodine value of 28 g $I_2$/100 g, Z-pol 2020L having an iodine value of 28 g $I_2$/100 g, Z-pol 2011 having an iodine value of 18 g $I_2$/100 g, Z-pol 2010L having an iodine value of 11 g $I_2$/100 g, Z-pol 2000 having an iodine value of 4 g $I_2$/100 g, Z-pol 2000L having an iodine value of 4 g $I_2$/100 g and Z-pol 3110 having an iodine value of 15 g $I_2$/100 g (each a product by Nippon Zeon Co.). These nitrile rubbers can be used as the component (B2) either singly or as a combination of two kinds or more according to need.

The third nitrile rubber as the component (B3) is an unhydrogenated or low-hydrogenated nitrile rubber having an iodine value in the range from 200 to 350 g $I_2$/100 g or, preferably, from 220 to 330 g $I_2$/100 g, of which the weight fraction of the acrylonitrile moiety is in the range from 20% to 50% or, preferably, from 25% to 45%. This nitrile rubber has no functional groups such as carboxyl groups at the molecular chain ends so that the nitrile rubber can be prepared by the binary copolymerization reaction of acrylonitrile and one or more of the diene monomers. When the weight fraction of the acrylonitrile moiety is too small, the adhesive composition cannot exhibit full adhesiveness while, when the weight fraction of the acrylonitrile moiety is too large, a remarkable decrease is caused in the electric properties of the composition along with a decrease in the compatibility of the nitrile rubber with organic solvents and the other polymeric ingredients adversely affecting the storage stability of the composition.

Several grades of commercial nitrile rubber products are available on the market to meet the above mentioned requirements for the component (B3) including those sold under the trade names of Nipols 1001 (iodine value 230 g $I_2$/100 g), 1031 (iodine value 230 g $I_2$/100 g), 1032 (iodine value 280 g $I_2$/100 g) and DN 225 (iodine value 280 g $I_2$/100 g) of which the weight fractions of the acrylonitrile moiety are about 40.5%, 40.5%, 33.5% and 33.5%, respectively (each a product by Nippon Zeon Co.). These nitrile rubbers can be used as the component (B3) either singly or as a combination of two kinds or more according to need.

It is essential in the formulation of the inventive adhesive composition that the above described first to third nitrile rubbers, i.e. the components (B1), (B2) and (B3), are compounded in a specific weight proportion. When the nitrile rubber constituent as the component (B) is a binary combination of the components (B1) and (B2), the weight proportion of B1:B2 is in the range from 85:15 to 40:60 or, preferably, from 80:20 to 60:40. When the amount of the component (B1) is too large relative to the component (B2), a decrease is caused in the adhesive performance of the adhesive composition after a prolonged heat treatment while, when the amount of the component (B1) is too small, curing of the adhesive composition would be incomplete so as to cause a decrease in the solvent resistance and heat resistance of the cured composition. Further, the weight ratio of B3:(B1+B2) should be in the range from 5:95 to 60:40 or, preferably, from 5:95 to 30:70 when the component (B) is a ternary combination of nitrile rubbers.

Though optional with an object to further improve the adhesive performance of the composition, the nitrile rubber constituent as the component (B) can be a ternary combination of the components (B1), (B2) and (B3) in such a weight proportion that the weight ratio of (B1+B3):B2 is in the range from 85:15 to 40:60 or, preferably, from 83:17 to 60:40 and the weight ratio of B1:(B2+B3) is in the range from 85:15 to 40:60 or, preferably, from 75:25 to 40:60. When the former weight ratio is too large or, namely, the amount of the component (B2) is too small relative to the other nitrile rubber components, the performance of the adhesive composition would be insufficient after a prolonged heat treatment while, when this weight ratio is too small, curing of the adhesive composition would be incomplete adversely affecting the solvent resistance and heat resistance of the cured adhesive composition. When the latter weight ratio is too small or, namely, the amount of the component (B1) is too small relative to the other nitrile rubber components, curing of the adhesive composition would be also incomplete adversely affecting the solvent resistance and heat resistance of the cured adhesive composition.

The amount of the component (B) or, namely, the total amount of the components (B1) and (B2) or components (B1), (B2) and (B3) is in the range from 30 to 150 parts by weight or, preferably, from 40 to 130 parts by weight per 100 parts by weight of the epoxy resin as the component (A). When the amount of the component (B) is too small, the adhesive composition cannor exhibit a high adhesive bonding strength while, when the amount thereof is too large, the adhesive composition after curing suffers a decrease in the heat resistance in soldering and solvent resistance.

The component (C) is a curing agent for the epoxy resin as the component (A), which is not particularly limitative and can be selected from various known compounds used as the curing agent of epoxy resins including aliphatic amine compounds, aromatic amine compounds, acid anhydride compounds, dicyandiamide, complexes of boron trifluoride and an amine compound and so on. These curing agents can be used either singly or as a combination of two kinds or more according to need. In particular, 4,4'-diamino diphenyl sulfone. referred to as DDS hereinafter, and 4,4'-diamino diphenyl methane, referred to as DDM hereinafter, are preferred in respect of the good heat resistance and storage stability of the composition compounded therewith.

The amount of the curing agent as the component (C) in the inventive adhesive composition is in the range from 2 to 20 parts by weight or, preferably, from 5 to 15 parts by weight per 100 parts by weight of the epoxy resin as the component (A). When the amount of the curing agent is too small, the epoxy resin cannot be fully cured as a matter of course so that a decrease is caused in the soldering heat resistance and electric properties of the adhesive composition. When the amount of the curing agent is too large, on the other hand, the curing reaction of the epoxy resin proceeds to an overly extent to cause brittleness of the cured adhesive composition along with an adverse influence by the excessive amount of the curing agent on the soldering heat resistance of the cured adhesive composition.

The component (D) in the inventive adhesive composition is a curing accelerator, which can be selected from the group consisting of imidazole compounds such as 2-alkyl-4-methyl imidazole compounds, 2-alkyl-4-ethyl imidazole compounds, 2-phenyl imidazole compounds and the like, metal borofluoride compounds such as tin borofluoride, zinc borofluoride and the like, metal octoate compounds such as tin octoate, zinc octoate and the like, and so on. These various curing accelerator compounds can be used either singly or as a combination of two kinds or more according to need. In particular, borofluoride compounds and metal octoate compounds are preferred because these curing accelerators give an adhesive composition having good storage stability and easy controllability of the flowability behavior.

The amount of the above described curing accelerator as the component (D) compounded in the inventive adhesive composition is in the range from 0.1 to 3 parts by weight or, preferably, from 0.3 to 1.5 parts by weight per 100 parts by weight of the epoxy resin as the component (A). When the amount of the curing accelerator is too small, the curing reaction of the adhesive composition cannot proceed at a good rate resulting in a decrease in the soldering heat resistance and electric properties of the adhesive composition. When the amount of the curing accelerator is too large, on the other hand, the curing reaction of the adhesive composition proceeds too rapidly not to exhibit a controllable adhesive bonding strength along with a disadvantage that the storage stability of the composition is decreased.

Though optional, it is sometimes advantageous that the thermosetting adhesive composition of the invention is further compounded with an appropriate amount of an inorganic filler as the component (E) including metal hydroxides such as aluminum hydroxide and magnesium hydroxide and metal oxides such as aluminum oxide. Compounding of an inorganic filler in the inventive adhesive composition has an effect to prevent a decrease in the peeling resistance and to improve the reproducibility in the adhesive bonding strength. These inorganic fillers can be used either singly or as a combination of two kinds or more according to need. The inorganic filler should have an average particle diameter not exceeding 5 $\mu$m or, preferably, not exceeding 1 $\mu$m.

The amount of the inorganic filler, if compounded in the inventive adhesive composition, is in the range from 5 to 50 parts by weight or, preferably, from 25 to 40 parts by weight per 100 parts by weight of the epoxy resin as the component (A). It is noted here that, while certain inorganic fillers such as zinc oxide and magnesium oxide have an activity as a vulcanizing agent for the nitrile rubbers as the component (B), these fillers having vulcanizing activity are categorized in the vulcanizing agent as the component (F) described later so that the amount thereof is not included in the above mentioned compounding amount of the component (E). It is further advantageous that the surface of the particles of the inorganic filler is hydrophobilized by the treatment with a coupling agent such as organosilane-based coupling agents and organic titanate-based coupling agents so as to improve the compatibility of the filler particles with the resinous matrix phase and to improve the water resistance and heat resistance of the adhesive composition. The inorganic filler can be compounded with the adhesive composition by using a conventional mixing machine such as pot mills, ball mills, roller mills, homogenizers and the like.

It is further optional with an object to accomplish full vulcanization of the nitrile rubbers as the component (B) that the inventive adhesive composition is compounded with, as the component (F), a vulcanizing agent for the nitrile rubbers including sulfur, zinc oxide, magnesium oxide and the like either singly or as a combination of two kinds or more according to need though not particularly limitative thereto. The amount of the vulcanizing agent as the component (F), if compounded, is in the range from 0.2 to 10 parts by weight or, preferably, from 1 to 5 parts by weight per 100 parts by weight of the epoxy resin as the component (A). When the amount of the vulcanizing agent is insufficient, the nitrile rubbers cannot be fully vulcanized so that a decrease is caused in the heat resistance and solvent resistance of the adhesive composition as cured while, when the amount of the vulcanizing agent is too large, the adhesive bonding strength of the adhesive composition is adversely affected.

Besides the above described various ingredients, it is of course optional that the inventive adhesive composition is admixed with various kinds of known additives conventionally used in adhesive compositions including phenolic resins, antioxidants and the like each in a limited amount.

It is preferable that the inventive adhesive composition is compounded with a bromine-containing ingredient such as a brominated epoxy resin as at least a part of the component (A) in order to impart the adhesive composition with flame retardancy. A preferable content of bromine is in the range from 18 to 30% by weight based on the total amount of the components (A), (B) and (C). When the bromine content in the adhesive composition is too low, the desired flame retardancy cannot be exhibited as a matter of course while, when the bromine content is too high, the adhesive composition suffers a decrease in the heat resistance and chemical resistance.

Besides the above mentioned brominated epoxy resin to serve as a bromine source for flame retardancy, the flame retardancy of the adhesive composition can be further enhanced by compounding the composition with auxiliary flame retardant agents such as other halogen compounds, antimony trioxide and the like although use of antimony trioxide is not always recommendable due to the toxicity of antimony to cause a problem of environmental pollution.

While the thermosetting adhesive composition of the invention can be obtained by uniformly compounding the above described essential and optional ingredients, it is advantageous and convenient that the adhesive composition is used in the form of a flowable liquid or pasty composition as diluted with a suitable organic solvent such as toluene, methyl alcohol, ethyl alcohol, isopropyl alcohol, acetone, methyl ethyl ketone and the like. The solid content in the thus diluted liquid or pasty composition is usually in the range from 20 to 45% by weight or, preferably, from 25 to 40% by weight. When the solid content is too low, evenness of the coating layer with the composition cannot be ensured while, when the solid content is too high, the consistency of the adhesive composition is so high as to cause a difficulty in the coating works therewith.

In the following, description is given on the typical procedures for the preparation of layered materials relating to flexible printed circuit boards by using the inventive thermosetting adhesive composition.

In the preparation of a coverlay film, an electrically insulating plastic resin film is uniformly coated with the inventive adhesive composition in the form of a flowable liquid having an appropriate viscosity by using a reverse roll coating machine, Comma Coater and the like followed by a heat treatment by passing through an in-line drying oven at a temperature in the range from 40 to 160° C. taking 2 to 20 minutes so that the solvent in the adhesive composition is evaporated and the adhesive composition in the coating layer is brought into a semi-cured state. A releasable protective sheet is then applied and bonded to the surface of the adhesive layer of the thus adhesive-coated plastic film by passing together through a heating roller at a temperature in the range from 20 to 160° C. by applying a linear pressure of 0.2 to 20 kg/cm.

The coating amount of the inventive adhesive composition should usually be such that an adhesive layer as dried has a thickness in the range from 15 to 50 $\mu$m. The adhesive layer forming a laminated product can be cured, if necessary, by a heat treatment, for example, at 20 to 160° C. for 1 to 600 minutes.

The procedure for the preparation of a bonding sheet by using the inventive adhesive composition is as follows. Thus, a first releasable sheet is uniformly coated on the releasing surface with the inventive adhesive composition in the form of a flowable liquid having an appropriate viscosity by using a reverse roll coating machine, Comma Coater and the like followed by a heat treatment by passing through an in-line drying oven at a temperature in the range from 40 to 160° C. taking 2 to 20 minutes so that the solvent in the adhesive composition is evaporated and the adhesive composition in the coating layer is brought into a semi-cured state. A second releasable protective sheet is then applied and bonded to the surface of the adhesive layer on the first releasable sheet by passing together through a heating roller at a temperature in the range from 20 to 160° C. by applying a linear pressure of 0.2 to 20 kg/cm. The thickness of the adhesive layer sandwiched between two releasable sheets is in the range from 15 to 50 $\mu$m as dried. It is optional depending on the particularly intended application of the bonding sheet that the above obtained three-layered laminate is subjected to a further heat treatment, for example, at 20 to 160° C. for 1 to 600 minutes to effect further curing of the adhesive composition.

The procedure for the preparation of a base sheet for flexible printed circuit boards by using the inventive adhesive composition is as follows. Thus, an electrically insulating plastic resin film as the substrate is uniformly coated with the inventive adhesive composition in the form of a flowable liquid having an appropriate viscosity by using a reverse roll coating machine, Comma Coater and the like followed by a heat treatment by passing through an in-line drying oven at a temperature in the range from 40 to 160° C. taking 2 to 20 minutes so that the solvent in the adhesive composition is evaporated and the adhesive composition in the coating layer is brought into a semi-cured state. A metal foil such as an aluminum foil or copper foil is then press-bonded to the surface of the semi-cured adhesive layer on the plastic resin film by passing together through a heating roller at a temperature in the range from 40 to 200° C. by applying a linear pressure of 0.2 to 20 kg/cm. The thickness of the adhesive layer sandwiched between the substrate film and the metal foil is in the range from 10 to 20 $\mu$m as dried. It is preferable that the above obtained three-layered laminate is subjected to a further heat treatment, for example, at 20 to 160° C. for 1 to 600 minutes to effect further curing of the adhesive composition.

In the following, the thermosetting adhesive composition of the present invention is illustrated in more detail by way of Examples and Comparative Examples with the formulations of the respective adhesive compositions and the results of the evaluation tests of the coveray films, bonding sheets and base sheets for flexible printed circuit boards prepared by using the respective adhesive compositions in the manners described above. In the following description, the term of "parts" always refers to "parts by weight".

In the formulation of the adhesive compositions prepared in the Examples and Comparative Examples, various materials characterized below were employed for the epoxy resin as the component (A), nitrile rubbers NBR as the components (B1), (B2) and (B3), curing agent as the component (C), curing accelerator as the component (D), inorganic filler as the component (E) and vulcanizing agent as the component (F).

Epoxy Resins
- A-a: Epikote 5050 (a brominated bisphenol A-type epoxy resin containing about 50% of bromine, a product by Yuka Shell Epoxy Co.)
- A-b: Epikote 5048 (a brominated bisphenol A-type epoxy resin containing about 25% of bromine, a product by Yuka Shell Epoxy Co.)
- A-c: Epikote 5045 (a brominated bisphenol A-type epoxy resin containing about 19% of bromine, a product by Yuka Shell Epoxy Co.)
- A-d: BREN-S (a brominated novolak-type epoxy resin containing about 35% of bromine, a product by Nippon Kayaku Co.)
- A-e: Epikote 828 (an unbrominated bisphenol A-type epoxy resin, a product by Yuka Shell Epoxy Co.)
- A-f: Epikote 154 (an unbrominated novolak-type epoxy resin, a product by Yuka Shell Epoxy Co.)
- A-g: EOCN 103S (an unbrominated novolak-type epoxy resin, a product by Nippon Kayaku Co.)

Nitrile Rubbers
- B1-h: Nipol 1072 (NBR containing about 27.0% of acrylonitrile and about 0.075% of carboxyl groups and having an iodine value of 270 g $I_2$/100 g, a product by Nippon Zeon Co.)
- B1-i: DN 631 (NBR containing about 32.5% of acrylonitrile and about 0.075% of carboxyl groups and having an iodine value of 270 g $I_2$/100 g, a product by Nippon Zeon Co.)
- B2-j: Zpol 2020 (NBR containing about 36% of acrylonitrile and having an iodine value of about 28 g $I_2$/100 g, a product by Nippon Zeon Co.)
- B2-k: Zpol 2000 (NBR containing about 36% of acrylonitrile and having an iodine value of about 4 g $I_2$/100 g, a product by Nippon Zeon Co.)
- B2-l: 2030 (NBR containing about 36% of acrylonitrile and having an iodine value of about 57 g $I_2$/100 g, a product by Nippon Zeon Co.)
- B3-m: Nipol 1032 (NBR containing about 33.5% of acrylonitrile and having an iodine value of 280 g $I_2$/100 g, a product by Nippon Zeon Co.)
- B3-n: Nipol 1001 (NBR containing about 40.5% of acrylonitrile and having an iodine value of 280 g $I_2$/100 g, a product by Nippon Zeon Co.)

Curing Agents
- C-o: DDS (supra)
- C-p: DDM (supra)

Curing Accelerators
- D-q: zinc octoate
- D-r: tin borofluoride (as a 45% aqueous solution)

Inorganic Fillers
- E-s: aluminum hydroxide having an average particle diameter of 0.6 $\mu$m (H43M, a product by Showa Denko Co.)
- E-t: magnesium hydroxide having an average particle diameter of 1.0 $\mu$m Vulcanizing Agents
- F-u: sulfur having an average particle diameter of 1.0 $\mu$m
- F-v: magnesium oxide having an average particle diameter of 0.6 $\mu$m
- F-w: zinc oxide having an average particle diameter of 0.1 $\mu$m The evaluation tests of the coverlay films, bonding sheets and base sheets for flexible printed circuit boards prepared in the Examples and Comparative Examples were undertaken for the following testing items by the respective testing procedures described there.

Testing Item 1
Peeling resistance
Testing was undertaken according to the procedure specified in JIS C6471 in which the copper foil on the sample sheet was patterned in a wiring circuit of 1 mm width by a conventional method including screen printing and etching of the copper foil and then the copper foil was peeled off by pulling in a perpendicular direction at a pulling velocity of 50 mm/minute so as to determine the peeling force in kg/cm.

Testing Item 2
Soldering heat resistance
Testing was undertaken according to the procedure specified in JIS C6471 in which a 25 mm by 25 mm square piece taken by cutting from the sample sheet after seasoning for 24 hours in an atmosphere of 60% relative humidity at 20° C. was put on the surface of a bath of a molten solder alloy at a varied temperature and kept floating thereon for 30 seconds followed by visual inspection of the appearance of the test piece to record the highest temperature of the solder alloy bath at which no abnormality such as blistering and exfoliation took place in the test piece.

Testing Item 3
Peeling resistance after long-term heating
Determination of the peeling force was undertaken in the same manner as in Testing item 1. described above for a test sample after heating at 150° C. for 240 hours.

Testing Item 4
Long-term heat resistance
The test samples of the coverlay films, bonding sheets and base sheets for flexible circuit boards after removal of the copper foil leaving the adhesive layer were heated at 150° C. for 240 hours and, after cooling, each of the test sheets was 5 times repeatedly folded double in a 180 degrees direction to visually detect breaking or exfoliation of the adhesive layer. The results were recorded in two ratings of A and B for non-occurrence and occurrence, respectively, of breaking or exfoliation of the adhesive layer.

Testing Item 5
Solvent resistance
A test specimen prepared in the same manner as in the measurement of the peeling resistance was dipped in methyl ethyl ketone at 50° C. for 10 minutes and then seasoned for 24 hours in an atmosphere of 60% relative humidity at 20° C. followed by measurement of the peeling force to record the ratio in % of the thus obtained peeling force to the peeling force before dipping in the solvent.

Testing Item 6

Line-to-line insulating resistance

Testing was undertaken according to the procedure specified in JIS C6471, in which a testing circuit as specified in IPC FC 241 was formed on the test sample which was seasoned for 96 hours in an atmosphere of 60% relative humidity at 20° C. followed by the measurement of the electric resistance between test lines.

Testing Item 7

Molten solder infiltration (applicable to coverlay films only)

A coverlay film having 20 perforations of each 5 mm diameter was press-bonded under heating onto the lustered surface of a rolled copper foil after a pickling treatment and the surface of the copper foil exposed through the perforations in the coverlay film was covered with a soldering paste (7310-25C-30-2, a product by Tamura Kaken Co.). The thus prepared test specimen was heated for 30 seconds on a reflow soldering alloy at a varied temperature followed by visual inspection of infiltration of the molten solder alloy into the interstice between the copper foil and the coverlay film by the aid of a magnifying lens. The results were recorded for the highest temperature at which the molten solder alloy did not infiltrate in a distance of 0.2 mm or longer from the periphery of the perforation in the coverlay film.

Testing Item 8

Flame retardancy

Measurement of the flame retardancy was undertaken according to the procedure specified in UL 94 Standard and the results were recorded in two ratings of A and B when the UL 94 V-0 value could be cleared or could not be cleared, respectively.

EXAMPLES 1 to 14 AND COMPARATIVE EXAMPLES 1 to 5

In each of Examples 1 to 6 and Comparative Examples 1 to 3, a thermosetting adhesive composition having a content of the non-volatile matters of 30% by weight was prepared by uniformly dissolving the respective ingredients indicated in Table 1 each in an amount given by parts including two or three kinds of the nitrile rubbers as the components B1, B2 and B3 in methyl ethyl ketone.

In each of Examples 7 to 14 and Comparative Examples 4 and 5, a thermosetting adhesive composition of 30% by weight of solid content was prepared in the same manner as above according to the formulation indicated in Table 1 followed by further compounding of the adhesive composition with an inorganic filler as the component (E) and a vulcanizing agent as the component (F) by using a ball mill each in an amount indicated in Table 1 in parts.

Table 1 also shows the content of bromine in the adhesive composition and the weight ratios of the amounts of the nitrile rubbers B1:B2, (B1+B3):B2, B1:(B2+B3) and B3:(B1+B2).

A polyimide film having a thickness of 25 μm (Capton Film, a product by Toray DuPont Co.) was uniformly coated with one of the above prepared adhesive solutions in a coating amount to give a dried adhesive layer of 30 μm thickness followed by heating at 100° C. for 10 minutes to remove the solvent and to bring the adhesive composition in the coating layer into a semicured state. Thereafter, a polyethylenecoated releasable paper sheet after a surface treatment with a silicone-based releasing agent was applied and press-bonded to the surface of the thus semi-cured adhesive layer at 60° C. under a linear pressure of 2 kg/cm to give a coverlay film which was subjected to the evaluation tests for the testing items 1 to 8 described above to give the results shown in Table 2. The procedure for the preparation of a test specimen for the evaluation tests was as follows.

Thus, the coverlay film freed from the silicone-treated releasable paper sheet was press-bonded on the adhesive surface to the lustered surface of a copper foil (BHN foil, supra) of 35 μm thickness by heating at 160° C. for 30 minutes under a pressure of 50 kg/cm$^2$ to give a test specimen for the evaluation tests. In the preparation of the test specimen for the molten solder infiltration test, the copper foil was used after washing by dipping for 30 seconds in an acid mixture of water, sulfuric acid and hydrogen peroxide in a weight ratio of 7:2:1 to remove the rustproof agent on the surface. The BHN foil as supplied was used as such in the preparation of the test specimens for the other testing items.

EXAMPLES 15 to 21 AND COMPARATIVE EXAMPLES 5 to 10

In each of Examples 15 to 18 and Comparative Examples 6 to 8, a thermosetting adhesive composition having a content of the non-volatile matters of 30% by weight was prepared by uniformly dissolving the respective ingredients indicated in Table 3 including two or three kinds of the nitrile rubbers as the components B1, B2 and B3 in methyl ethyl ketone each in an amount indicated in the table in parts.

In each of Examples 19 to 21 and Comparative Examples 9 and 10, a thermosetting adhesive composition of 30% by weight of solid content was prepared in the same manner as described above according to the formulation indicated in Table 3 followed by further compounding of the adhesive composition with an inorganic filler as the component (E) and a vulcanizing agent as the component (F) by using a ball mill each in an amount indicated in the table.

Table 3 also shows the content of bromine in each composition and the weight ratios of the amounts of the nitrile rubbers B1:B2, (B1+B3):B2, B1:(B2+B3) and B3:(B1+B2).

A polyethylene terephthalate film having a thickness of 25 μm was uniformly coated on the surface treated with a silicone-based releasing agent with one of the above prepared adhesive compositions in a coating amount to give a dried adhesive layer of 50 μm thickness by using a reverse roll coating machine followed by a heat treatment at 100° C. for 10 minutes to remove the solvent by evaporation and to bring the adhesive composition to a semi-cured state. Thereafter, a polyethylene-coated paper treated on the surface with a silicone-based releasing agent was press-bonded to the surface of the semi-cured adhesive layer on the polyethylene terephthalate film at a temperature of 60° C. under a linear pressure of 2 kg/cm to give a bonding sheet, which was subjected to the evaluation tests for the testing items described above excepting for the molten solder infiltration test (testing item 7) to give the results shown in Table 4. The procedure for the preparation of the test specimen of the bonding sheet was as follows.

Thus, the bonding sheet freed from one of the releasable sheets was mounted on the lustered surface of a 35 μm thick BHN foil (supra) of copper by temporal tacking followed by removal of the other releasable sheet. Thereafter, a fresh Capton Film (supra) of 25 μm thickness was mounted on the exposed surface of the adhesive layer and a three-layered test specimen consisting of the Capton Film, adhesive layer and BHN foil in this order was obtained by press-bonding with heating for 30 minutes at 160° C. under a pressure of 50 kg/cm$^2$.

EXAMPLES 22 to 29 AND COMPARATIVE EXAMPLES 11 to 15

In each of Examples 22 to 25 and Comparative Examples 11 to 13, a thermosetting adhesive composition having a content of the non-volatile matters of 30% by weight was prepared by uniformly dissolving the respective ingredients indicated in Table 5 including two or three kinds of the nitrile rubbers as the components B1, B2 and B3 in methyl ethyl ketone each in an amount indicated in the table in parts.

In each of Examples 26 to 29 and Comparative Examples 14 and 15, a thermosetting adhesive composition of 30% by weight of solid content was prepared in the same manner as described above according to the formulation indicated in Table 5 followed by further compounding of the adhesive composition with an inorganic filler as the component (E) and a vulcanizing agent as the component (F) by using a ball mill each in an amount indicated in Table 5.

Table 5 also shows the content of bromine in the adhesive composition and the weight ratios of the amounts of the nitrile rubbers B1:B2, (B1+B3):B2, B1:(B2+B3) and B3:(B1+B2).

In the next place, a polyimide resin film (Capton Film, a product by Toray DuPont Co.) having a thickness of 25 μm was ciated on one surface with the adhesive solution in such a coating amount as to give a dried adhesive layer of 18 μm thickness by using a reverse roll coater followed by a heat treatment at 120 for 10 minutes to evaporate the solvent and to bring the adhesive composition into a semi-cured state. Thereafter, an electrolytic copper foil having a thickness of 35 μm (JTC Foil, a product by Japan Energy Co.) was applied and bonded to the semi-cured adhesive layer on the polyimide film by rolling at 100° C. under a linear pressure of 2 kg/cm followed by a stepwise heat treatment first at 80° C. for 1 hour and then at 150° C. for 2 hours to obtain a base sheet for flexible printed circuit boards with the adhesive composition fully cured.

Each of the above obtained thermosetting adhesive compositions was used in the preparation of a base sheet for flexible printed circuit board, which was subjected to the evaluation tests for the testing items described above excepting for the molten solder infiltration test (testing item 7) to give the results shown in Table 6.

TABLE 1

| Component | Example | | | | | | | | | | | | | | | Comparative Example | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 1 | 2 | 3 | 4 | 5 |
| A-a | 60 | 80 | | 60 | 60 | 80 | 60 | 50 | | 80 | 80 | 60 | 40 | 80 | 60 | 60 | 100 | 60 | 60 |
| A-b | | | | | 20 | | | 10 | | | | | | | | | | | 30 |
| A-c | 10 | | | 10 | | | 10 | | | | | 30 | | | 10 | | | 20 | |
| A-d | | | 40 | | | 20 | | 10 | | 10 | | | | 20 | | | | | |
| A-e | 30 | 20 | 30 | 30 | | | 30 | 20 | 70 | | 20 | 10 | 30 | | 30 | | | 20 | |
| A-f | | | 30 | | | | | | 30 | | | | 30 | 20 | | | | | 10 |
| A-g | | | | | 20 | | | 10 | | 10 | | | | | | 20 | | | |
| B1-h | | | 25 | 30 | | 60 | | 40 | | 50 | | 40 | 35 | 30 | 45 | | 120 | 30 | 15 |
| B1-i | 35 | 30 | 10 | | 50 | | 35 | | 30 | 30 | 30 | | | | | 20 | | | |
| B2-j | | | | 15 | | | | 20 | | | | 20 | 15 | | 5 | 10 | | 15 | 7 |
| B2-k | 15 | 8 | | | | 30 | 15 | | | | 8 | | | | | 60 | | | |
| B2-l | | | 8 | | 20 | | | 15 | 25 | | | | 20 | | 40 | | | | |
| B3-m | | | | 10 | | 10 | | 10 | | | | 10 | | 10 | | | | | 3 |
| B3-n | | | | | 5 | | | | 5 | 26 | | | | | | 10 | | | |
| Br content, % | 20.6 | 28.0 | 9.3 | 20.0 | 18.9 | 22.4 | 20.6 | 17.2 | 0.0 | 18.5 | 28.0 | 22.5 | 12.9 | 23.8 | 20.6 | 19.5 | 17.5 | 19.4 | 28.4 |
| B1:B2 | 2.33 | 3.75 | 4.38 | 2.00 | 2.50 | 2.00 | 2.33 | 2.00 | 2.00 | 3.20 | 3.75 | 2.00 | 2.33 | 1.50 | 9.00 | 0.40 | 2.00 | 2.00 | 2.14 |
| (B1 + B3):B2 | | | | 2.67 | 2.75 | 2.33 | | 2.50 | 2.33 | 4.00 | | 2.50 | | 2.00 | | 0.60 | | | 2.57 |
| B1:(B2 + B3) | | | | 1.20 | 2.00 | 1.50 | | 1.33 | 1.50 | 1.78 | | 1.33 | | 1.00 | | 0.33 | | | 1.50 |
| B3:(B1 + B2) | | | | 0.22 | 0.07 | 0.11 | | 0.17 | 0.11 | 0.19 | | 0.17 | | 0.20 | | 0.14 | | | 0.14 |
| C-o | 5 | | 7 | 5 | | 5 | 5 | | | 10 | | | 5 | 8 | 5 | 10 | | 30 | |
| C-p | | 5 | | | 10 | 5 | | 10 | 12 | | 5 | 10 | | | | | 5 | | 7 |
| D-q | | 0.5 | 0.5 | | 0.7 | | | 0.5 | | 1 | 0.5 | | 0.5 | | | 0.5 | | 10 | |
| D-r | 0.5 | | | 0.5 | | 1 | 0.5 | | 0.5 | | | 0.5 | | 1 | 0.5 | | 1 | | 0.5 |
| E-s | | | | | | 20 | | | | 10 | 20 | | 30 | 40 | | | | 30 | |
| E-t | | | | | | | | 25 | 25 | 20 | | 30 | | | | | | | 15 |
| F-u | | | | | | | | | | 2 | | | | | | | | | |
| F-v | | | | | | | | | 2 | | | | | | | | | | 2 |
| F-w | | | | | | | 2 | | | 3 | | 2 | 2 | 2 | 3 | | | 2 | |

TABLE 2

| Testing Item | Example 1 | 2 | 3 | 4 | 5 | 6 | 7 | 8 | 9 | 10 | 11 | 12 | 13 | 14 | Comparative Example 1 | 2 | 3 | 4 | 5 |
|---|---|---|---|---|---|---|---|---|---|---|---|---|---|---|---|---|---|---|---|
| (1), kg/cm | 1.5 | 1.3 | 1.4 | 1.7 | 1.8 | 1.9 | 1.6 | 1.8 | 1.8 | 2.1 | 1.5 | 1.8 | 1.6 | 1.8 | 1.4 | 1.7 | 2.1 | 1.0 | 0.6 |
| (2), °C | 330 | 340 | 350 | 330 | 330 | 330 | 340 | 340 | 360 | 340 | 340 | 340 | 340 | 340 | 340 | 300 | 310 | 310 | 340 |
| (3), kg/cm | 0.6 | 0.6 | 0.5 | 0.6 | 0.5 | 0.6 | 0.6 | 0.6 | 0.6 | 0.5 | 0.6 | 0.6 | 0.6 | 0.5 | 0.2 | 0.7 | 0.6 | 0.5 | 0.3 |
| (4) | A | A | A | A | A | A | A | A | A | A | A | A | A | A | B | A | A | A | B |
| (5), % | 75 | 90 | 80 | 80 | 85 | 75 | 80 | 95 | 95 | 75 | 95 | 85 | 80 | 80 | 90 | 40 | 60 | 85 | 95 |
| (6), × $10^{12}$ ohm | 20 | 30 | 20 | 20 | 20 | 10 | 20 | 30 | 40 | 10 | 40 | 20 | 30 | 20 | 30 | 0.1 | 1 | 1 | 50 |
| (7), °C | 230 | 230 | 230 | 230 | 230 | 230 | 230 | 230 | 240 | 220 | 230 | 230 | 230 | 230 | 230 | 210 | 200 | 210 | 240 |
| (8) | A | A | B | A | A | A | A | A | B | A | A | A | B | A | A | A | A | A | A |

TABLE 3

| Component | Example 15 | 16 | 17 | 18 | 19 | 20 | 21 | Comparative Example 6 | 7 | 8 | 9 | 10 |
|---|---|---|---|---|---|---|---|---|---|---|---|---|
| A-a | 60 | 80 |  | 40 | 50 | 60 |  | 60 |  | 80 | 60 | 60 |
| A-b | 20 |  |  | 20 |  |  |  | 20 |  |  | 20 | 30 |
| A-c |  |  |  |  |  | 20 |  |  |  |  |  |  |
| A-d |  |  |  | 20 | 30 |  |  |  |  |  |  |  |
| A-e | 20 |  | 60 |  | 20 |  | 80 | 20 | 100 | 10 |  |  |
| A-f |  | 20 | 20 | 20 |  |  |  |  |  |  | 20 | 10 |
| A-g |  |  | 20 |  |  | 20 | 20 |  |  | 10 |  |  |
| B1-h |  | 35 | 30 |  | 30 |  | 30 |  | 100 | 60 | 15 | 10 |
| B1-I | 30 |  | 30 | 30 |  | 30 |  | 30 | 50 |  |  |  |
| B2-j | 10 |  | 25 | 15 |  | 10 |  | 10 |  |  | 5 | 20 |
| B2-k |  |  |  | 20 |  | 10 |  |  | 40 | 5 |  |  |
| B2-l |  | 10 |  |  |  | 10 |  |  |  |  |  | 15 |
| B3-m |  |  | 15 |  | 10 |  |  |  | 10 |  | 5 |  |
| B3-n |  |  |  | 10 | 5 |  | 10 |  |  | 5 |  | 10 |
| Br content, % | 24.1 | 26.7 | 0.0 | 20.0 | 20.6 | 23.4 | 0.0 | 20.6 | 0.0 | 22.9 | 26.5 | 23.4 |
| B1:B2 | 3.00 | 3.50 | 2.40 | 2.00 | 1.50 | 3.00 | 1.50 | 3.00 |  | 3.75 | 12.00 | 3.00 | 0.29 |
| (B1 + B3):B2 |  |  | 3.00 | 2.67 | 2.25 |  | 2.00 |  |  | 4.00 | 13.00 | 4.00 | 0.57 |
| B1:(B2 + B3) |  |  | 1.50 | 1.20 | 0.86 |  | 1.00 |  |  | 3.00 | 6.00 | 1.50 | 0.22 |
| B3:(B1 + B2) |  |  | 0.18 | 0.22 | 0.30 |  | 0.20 |  |  | 0.05 | 0.08 | 0.33 | 0.22 |
| C-o | 5 |  | 10 | 5 |  | 5 | 5 | 30 | 10 |  |  |  |
| C-p |  | 5 |  |  | 7 |  | 5 |  |  | 5 | 7 | 5 |
| D-q | 0.5 |  | 1 |  | 0.5 | 0.5 |  | 1.2 |  | 0.5 |  |  |
| D-r |  | 0.5 |  | 0.5 |  |  | 0.5 | 10 |  | 0.5 |  | 0.5 |
| E-s |  |  |  |  | 25 |  | 10 |  |  |  | 20 |  |
| E-t |  |  |  |  | 20 | 20 |  |  |  |  |  | 30 |
| F-u |  |  |  |  |  |  | 3 |  |  |  |  |  |
| F-v |  |  |  | 2 |  |  |  |  |  |  |  | 2 |
| F-w |  |  |  |  |  |  |  |  | 2 |  | 2 |  |

TABLE 4

| Testing Item | Example 15 | 16 | 17 | 18 | 19 | 20 | 21 | Comparative Example 6 | 7 | 8 | 9 | 10 |
|---|---|---|---|---|---|---|---|---|---|---|---|---|
| (1), kg/cm | 1.4 | 1.5 | 1.8 | 1.7 | 1.9 | 1.6 | 1.9 | 1.0 | 2.1 | 1.6 | 0.6 | 1.8 |
| (2), °C | 330 | 330 | 350 | 330 | 340 | 340 | 360 | 310 | 310 | 330 | 340 | 300 |
| (3), kg/cm | 0.6 | 0.5 | 0.6 | 0.6 | 0.7 | 0.6 | 0.7 | 0.4 | 0.6 | 0.2 | 0.3 | 0.6 |
| (4) | A | A | A | A | A | A | A | A | A | B | B | A |
| (5), % | 85 | 80 | 75 | 75 | 80 | 90 | 85 | 85 | 55 | 85 | 95 | 45 |
| (6), × $10^{12}$ ohm | 30 | 20 | 10 | 20 | 10 | 40 | 30 | 1 | 0.5 | 20 | 50 | 0.1 |
| (8) | A | A | B | A | A | A | B | A | B | A | A | A |

TABLE 5

| Component | Example 22 | 23 | 24 | 25 | 26 | 27 | 28 | 29 | Comparative Example 11 | 12 | 13 | 14 | 15 |
|---|---|---|---|---|---|---|---|---|---|---|---|---|---|
| A-a | | | 60 | 50 | 80 | 40 | | 60 | 60 | | 80 | 60 | |
| A-b | | 20 | | | 20 | 40 | | | 20 | | | 20 | 60 |
| A-c | | | | 30 | | | | 20 | | | | | |
| A-d | | 70 | 20 | | | | | | | | 20 | | 20 |
| A-e | 70 | | | | | 20 | 60 | | 20 | 60 | | | |
| A-f | 30 | | 20 | | | | 40 | | | 20 | | | 20 |
| A-g | | 10 | | 20 | | | | 20 | | 20 | | 20 | |
| B1-h | 35 | | 30 | | 40 | | | 40 | 30 | 50 | | 60 | 10 | 
| B1-I | | 30 | | 25 | 40 | 30 | | | | | 50 | 60 | |
| B2-j | | | 15 | | 20 | | 10 | 20 | | | | 40 | 5 |
| B2-k | 15 | | | | | | | | 5 | 20 | | | |
| B2-l | | 10 | | 8 | | 10 | | | | | 40 | | |
| B3-m | | | 10 | | | | 5 | 15 | | 10 | 20 | 10 | 5 |
| B3-n | | | | 5 | | | | | | | | | |
| Br content, % | 0.0 | 20.1 | 23.1 | 21.7 | 22.0 | 20.7 | 0.0 | 19.4 | 21.9 | 0.0 | 16.5 | 21.2 | 16.9 |
| B1:B2 | 2.33 | 3.00 | 2.00 | 3.13 | 4.00 | 3.00 | 4.00 | 1.50 | 10.00 | 2.50 | 3.00 | 0.25 | 3.00 |
| (B1 + B3):B2 | | | 2.67 | 3.75 | | | 4.50 | 2.25 | | 3.00 | 3.50 | 0.50 | 4.00 |
| B1:(B2 + B3) | | | 1.20 | 1.92 | | | 2.67 | 0.86 | | 1.67 | 2.00 | 0.20 | 1.50 |
| B3:(B1 + B2) | | | 0.22 | 0.15 | | | 0.10 | 0.30 | | 0.14 | 0.13 | 0.02 | 0.25 |
| C-o | 10 | 7 | 5 | | | 5 | | 10 | | 40 | | 5 | 5 |
| C-p | | | | 5 | 5 | | 12 | | 5 | | 5 | | |
| D-q | | 0.5 | | 0.5 | 1 | 0.5 | | 1 | 0.5 | | 1.5 | 0.5 | |
| D-r | 0.7 | | 0.5 | | | | 0.5 | | | 10 | | | 0.5 |
| E-s | | | | | 15 | | | 10 | | | | 10 | |
| E-t | | | | | | 10 | 10 | 5 | | | | | 10 |
| F-u | | | | | | | | 2 | | | | | 2 |
| F-v | | | | | | | 2 | | | | | | |
| F-w | | | | | 3 | | 3 | | | | | 2 | |

TABLE 6

| Testing Item | Example 22 | 23 | 24 | 25 | 26 | 27 | 28 | 29 | Comparative Example 11 | 12 | 13 | 14 | 15 |
|---|---|---|---|---|---|---|---|---|---|---|---|---|---|
| (1), kg/cm | 1.6 | 1.5 | 1.5 | 1.9 | 2.0 | 1.6 | 1.8 | 2.1 | 1.5 | 1.2 | 2.2 | 2.0 | 1.0 |
| (2), °C | 360 | 340 | 330 | 370 | 340 | 340 | 370 | 340 | 330 | 310 | 310 | 320 | 340 |
| (3), kg/cm | 0.7 | 0.5 | 0.6 | 0.6 | 0.6 | 0.5 | 0.6 | 0.7 | 0.2 | 0.4 | 0.5 | 0.8 | 0.4 |
| (4) | A | A | A | A | A | A | A | A | B | B | A | A | A |
| (5), % | 85 | 90 | 90 | 80 | 90 | 95 | 95 | 85 | 90 | 90 | 70 | 60 | 95 |
| (6), × $10^{12}$ ohm | 30 | 30 | 20 | 10 | 10 | 40 | 30 | 10 | 20 | 0.5 | 1 | 1 | 40 |
| (8) | B | A | A | B | A | A | B | A | A | B | A | A | A |

What is claimed is:

1. A thermosetting adhesive composition which comprises, as a uniform blend:

(A) 100 parts by weight of an epoxy resin;

(B) from 30 to 150 parts by weight of a combination of nitrile rubbers consisting of (B1) a first nitrile rubber, of which the weight fraction of the acrylonitrile moiety is in the range from 20% to 50%, having an iodine value in the range from 200 to 350 g $I_2$/100 g and containing carboxyl groups as functional groups at the molecular chain ends in an amount in the range from 0.005% to 5% by weight, (B2) a second nitrile rubber, of which the weight fraction of the acrylonitrile moiety is in the range from 20% to 50%, having an iodine value not exceeding 60 g $I_2$/100 g and free from functional groups at the molecular chain ends, and (B3) a third nitrile rubber, of which the weight fraction of the acrylonitrile moiety is in the range from 20% to 50%, having an iodine value in the range from 200 to 350 g $I_2$/100 g and free from functional groups at the molecular chain ends, in such a weight proportion that the ratio of (B1+B3):B2 is in the range from 85:15 to 40:60 and the ratio of B1:(B2+B3) is in the range from 85:15 to 40:60;

(C) from 2 to 20 parts by weight of a curing agent for the epoxy resin; and (D) from 0.1 to 3 parts by weight of a curing accelerator selected from the group consisting of imidazole compounds, borofluoride compounds and metal salts of octoic acid.

2. The thermosetting adhesive composition as claimed in claim 1 in which each of the ratios (B1+B3):B2 and B1:(B2+B3) is equal to the ratio of B1:B2.

3. The thermosetting adhesive composition as claimed in claim 1 in which the component (B) consists of the nitrile rubbers (B1), (B2) and (B3) in such a weight proportion that the ratio of B3:(B1+B2) is in the range from 5:95 to 60:40.

4. The thermosetting adhesive composition as claimed in claim 1 which further comprises:

(E) from 5 to 50 parts by weight of an inorganic filler.

5. The thermosetting adhesive composition as claimed in claim 1 which further comprises:

(F) from 0.2 to 10 parts by weight of a vulcanizing agent for the nitrile rubbers.

6. The thermosetting adhesive composition as claimed in claim 1 in which the epoxy resin as the component (A) is a combination of at least two kinds of epoxy resins of which at least one is a brominated epoxy resin.

7. The thermosetting adhesive composition as claimed in claim 6 in which the content of bromine is in the range from 18% to 30% by weight based on the total amount of the components (A), (B) and (C).

8. The thermosetting adhesive composition as claimed in claim 1 in which the weight proportion of the components (B1), (B2) and (B3) is such that the ratio of (B1+B3):B2 is in the range from 83:17 to 60:40 and the ratio of B1:(B2+B3) is in the range from 75:25 to 40:60.

9. The thermosetting adhesive composition as claimed in claim 1 in which the amount of the component (B) is in the range from 40 to 130 parts by weight per 100 parts by weight of the component (A).

10. The thermosetting adhesive composition as claimed in claim 1 in which the curing agent as the component (C) is selected from the group consisting of aliphatic amine compounds, aromatic amine compounds, acid anhydride compounds, dicyandiamide and boron trifluoride-amine complexes.

11. The thermosetting adhesive composition as claimed in claim 1 in which the amount of the component (C) is in the range from 5 to 15 parts by weight per 100 parts by weight of the component (A).

12. The thermosetting adhesive composition as claimed in claim 1 in which the curing accelerator as the component (D) is selected from the group consisting of borofluoride compounds and metal salts of octoic acid.

13. The thermosetting adhesive composition as claimed in claim 1 in which the amount of the component (D) is in the range from 0.5 to 1.5 parts by weight per 100 parts by weight of the component (A).

14. The thermosetting adhesive composition as claimed in claim 4 in which the inorganic filler as the component (E) is selected from the group consisting of aluminum hydroxide, magnesium hydroxide and aluminum oxide.

15. The thermosetting adhesive composition as claimed in claim 4 in which the amount of the component (E) is in the range from 25 to 40 parts by weight per 100 parts by weight of the component (A).

16. The thermosetting adhesive composition as claimed in claim 5 in which the vulcanizing agent as the component (F) is selected from the group consisting of sulfur, zinc oxide and magnesium oxide.

17. The thermosetting adhesive composition as claimed in claim 5 in which the amount of the component (F) is in the range from 1 to 5 parts by weight per 100 by weight of the component (A).

* * * * *

UNITED STATES PATENT AND TRADEMARK OFFICE
CERTIFICATE OF CORRECTION

PATENT NO. : 6,054,509
DATED : April 25, 2000
INVENTOR(S) : Hitoshi Arai et al.

It is certified that error appears in the above-identified patent and that said Letters Patent is hereby corrected as shown below:

Column 2,
Lines 43 and 51, change "g $1_2$/100 g" to -- g $I_2$/100 g --;

Column 3,
Lines 5, 13 and 16, change "g $1_2$/100 g" to -- g $I_2$/100 g --;

Column 5,
Line 21, two occurrences, change "g $1_2$/100 g" to -- g $I_2$/100 g --;
Line 60, two occurrences, change "g $1_2$/100 g" to -- g $I_2$/100 g --;
Line 61, change "g $1_2$/100 g" to -- g $I_2$/100 g --;
Line 62, two occurrences, change "g $1_2$/100 g" to -- g $I_2$/100 g --;

Column 6,
Lines 5, 6, 29, 30 and 31, change "g $1_2$/100 g" to -- g $I_2$/100 g --;
Line 32, two occurrences, change "g $1_2$/100 g" to -- g $I_2$/100 g --;
Lines 33, 34, 35, 36, 37, 43 and 44, change "g $1_2$/100 g" to -- g $I_2$/100 g --;
Line 63, two occurrences, change "g $1_2$/100 g" to -- g $I_2$/100 g --;
Line 64, change "g $1_2$/100 g" to -- g $I_2$/100 g --;

Column 11,
Lines 44, 48, 51, 54, 57, 60 and 63, change "g $1_2$/100 g" to -- g $I_2$/100 g --;

Column 19,
Lines 56, 62 and 67, change "g $1_2$/100 g" to -- g $I_2$/100 g --;

Signed and Sealed this

Seventeenth Day of June, 2003

JAMES E. ROGAN
*Director of the United States Patent and Trademark Office*